(12) United States Patent
Park et al.

(10) Patent No.: US 9,711,545 B2
(45) Date of Patent: *Jul. 18, 2017

(54) METHOD OF FABRICATING DISPLAY DEVICE

(71) Applicant: Samsung Display Co. Ltd., Yongin (KR)

(72) Inventors: Ji Young Park, Hwaseong-si (KR); Dong Il Kim, Suwon-si (KR); Sang Gab Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/262,943

(22) Filed: Sep. 12, 2016

(65) Prior Publication Data

US 2016/0380011 A1    Dec. 29, 2016

Related U.S. Application Data

(62) Division of application No. 14/081,033, filed on Nov. 15, 2013, now Pat. No. 9,466,623.

(30) Foreign Application Priority Data

Aug. 2, 2013    (KR) .......................... 10-2013-0092103

(51) Int. Cl.
*H01L 27/12*    (2006.01)
*G02F 1/1333*    (2006.01)
(Continued)

(52) U.S. Cl.
CPC ........ *H01L 27/1288* (2013.01); *H01L 27/124* (2013.01); *G02F 1/1368* (2013.01);
(Continued)

(58) Field of Classification Search
None
See application file for complete search history.

(56) References Cited

U.S. PATENT DOCUMENTS 4,818,327 A    4/1989 Davis et al.
5,166,757 A    11/1992 Kitamura et al.
(Continued)

FOREIGN PATENT DOCUMENTS

KR    100172526 B1    10/1998
KR    1020000020846 A    4/2000
(Continued)

*Primary Examiner* — Kimberly Rizkallah
*Assistant Examiner* — Bo Bin Jang
(74) *Attorney, Agent, or Firm* — Cantor Colburn LLP

(57) ABSTRACT

A method of fabricating a display device includes forming a thin-film transistor including a gate electrode, a source electrode and a drain electrode on a substrate, forming a first insulating layer and a second insulating layer on the thin-film transistor, forming a common electrode on the second insulating layer by depositing a common electrode material on the second insulating layer, plasma-treating a photoresist pattern on the common electrode material, and etching the common electrode material using the plasma-treated photoresist pattern as a mask, defining a contact hole in the second insulating layer which corresponds to the drain electrode using the plasma-treated photoresist pattern and the common electrode as a mask, forming a third insulating layer on the second insulating layer and the common electrode to expose the contact hole and the drain electrode and forming a pixel electrode connected to the drain electrode on the third insulating layer.

8 Claims, 21 Drawing Sheets

(51) Int. Cl.
    *G02F 1/1343*     (2006.01)
    *G02F 1/1362*     (2006.01)
    *G02F 1/1368*     (2006.01)

(52) U.S. Cl.
    CPC .... *G02F 1/13439* (2013.01); *G02F 1/133345* (2013.01); *G02F 1/136286* (2013.01); *G02F 2201/121* (2013.01); *G02F 2201/123* (2013.01)

(56) References Cited

U.S. PATENT DOCUMENTS

| | | |
|---|---|---|
| 8,735,891 B2 | 5/2014 | Park et al. |
| 2006/0076562 A1 | 4/2006 | Lee et al. |
| 2008/0182419 A1 | 7/2008 | Yasui et al. |
| 2012/0238098 A1 | 9/2012 | Uda et al. |
| 2013/0020591 A1 | 1/2013 | Park et al. |
| 2013/0071973 A1 | 3/2013 | Beak et al. |

FOREIGN PATENT DOCUMENTS

| | | |
|---|---|---|
| KR | 1020020086973 A | 11/2002 |
| KR | 1020100033710 A | 3/2010 |
| KR | 1020110071313 A | 6/2011 |
| KR | 1020110127919 A | 11/2011 |
| KR | 1020120061540 A | 6/2012 |
| KR | 1020130011856 A | 1/2013 |

METHOD OF FABRICATING DISPLAY DEVICE

This application is a divisional of U.S. patent application Ser. No. 14/081,033, filed on Nov. 15, 2013, which claims priority to Korean Patent Application No. 10-2013-0092103 filed on Aug. 2, 2013, and all the benefits accruing therefrom under 35 U.S.C. §119, the disclosure of which is incorporated herein by reference in its entirety.

BACKGROUND

1. Field

The invention relates to a method of fabricating a display device.

2. Description of the Related Art

Liquid crystal displays ("LCDs") are one of the most widely used types of displays. An LCD controls an arrangement of liquid crystal molecules of a liquid crystal layer interposed between the two facing electrodes by applying voltages to the two facing electrodes. In so doing, the LCD adjusts the amount of light that transmits through the liquid crystal layer.

LCDs can be made thin but have poor lateral visibility compared with front visibility. To overcome this disadvantage, various liquid crystal arrangements and driving methods are being developed.

LCDs are drawing attention because electric field generating electrodes (i.e., a common electrode and a pixel electrode) are all formed on one substrate in the LCDs in order to realize wide viewing angle. That is, research is being conducted on a plane to line switching ("PLS") LCD in which a common electrode and a pixel electrode (i.e., electric field generating electrodes) are formed on one substrate and a gap between the common electrode and the pixel electrode is smaller than a gap between two substrates such that a fringe field is formed above the common electrode and the pixel electrode.

Typically, an insulating layer is disposed under the common electrode and the pixel electrode. To define a contact hole in the insulating layer, a photoresist pattern needs to be formed on the insulating layer. That is, the contact hole is defined in the insulating layer by dry-etching the insulating layer using the photoresist pattern as a mask.

SUMMARY

Since a material that forms an insulating layer is similar to a material that forms a photoresist pattern, an etch rate of the insulating layer is similar to an etch rate of the photoresist pattern. Accordingly, the photoresist pattern is required to have a thickness equal to or greater than a depth of a contact hole defined in the insulating layer. For this reason, the amount of photoresist used is increased, and the thick photoresist pattern makes it difficult to define a contact hole having a fine width in the insulating layer.

Exemplary embodiments of the invention provide a method of fabricating a display device, which can reduce the amount of photoresist used to define a contact hole in an insulating layer and by which a contact hole having a fine width can be defined using a thin photoresist pattern.

However, exemplary embodiments of the invention are not restricted to the one set forth herein. The above and other exemplary embodiments of the invention will become more apparent to one of ordinary skill in the art to which the invention pertains by referencing the detailed description of the invention given below.

According to an exemplary embodiment of the invention, there is provided a method of fabricating a display device, the method including forming a thin-film transistor, which includes a gate electrode, a source electrode and a drain electrode, on a substrate, forming a first insulating layer and a second insulating layer on the thin-film transistor, forming a common electrode on the second insulating layer by depositing a common electrode material on the second insulating layer, plasma-treating a surface of a photoresist pattern provided on the common electrode material, and then etching the common electrode material using the plasma-treated photoresist pattern as a mask, defining a contact hole in a region of the second insulating layer which corresponds to the drain electrode by using the plasma-treated photoresist pattern and the common electrode as a mask, forming a third insulating layer on the second insulating layer and the common electrode to expose the contact hole and the drain electrode, and forming a pixel electrode, which is connected to the drain electrode, on the third insulating layer.

The forming the second insulating layer may be achieved by coating an organic material on a whole surface of the first insulating layer.

The defining the contact hole may be achieved by a dry-etching method.

In the defining the contact hole, a thickness of the plasma-treated photoresist pattern may be smaller than a depth of the contact hole.

The plasma-treating of the surface of the photoresist pattern may use hydrogen bromide (Hbr) plasma that includes Hbr.

The common electrode may include indium zinc oxide ("IZO") or amorphous-indium tin oxide ("a-ITO").

The forming the thin-film transistor may include forming a common line on the substrate, the forming the third insulating layer includes exposing the common line and the common electrode, and the forming the pixel electrode includes forming a connection electrode which connects the common line and the common electrode.

The method of fabricating a display device may further include forming a black matrix or a color filter between the first insulating layer and the second insulating layer.

According to another exemplary embodiment of the invention, there is provided a method of fabricating a display device, the method comprising forming a thin-film transistor, which includes a gate electrode, a source electrode and a drain electrode, on a substrate, forming a first insulating layer and a second insulating layer on the thin-film transistor, forming a common electrode on the second insulating layer by depositing a common electrode material on the second insulating layer, etching the common electrode material using a photoresist pattern provided on the common electrode material as a mask, and then plasma-treating a surface of the photoresist pattern, defining a contact hole in a region of the second insulating layer which corresponds to the drain electrode by using the plasma-treated photoresist pattern and the common electrode as a mask, forming a third insulating layer on the second insulating layer and the common electrode to expose the contact hole and the drain electrode, and forming a pixel electrode, which is connected to the drain electrode, on the third insulating layer.

The forming the second insulating layer may be achieved by coating an organic material on a whole surface of the first insulating layer.

The defining the contact hole may be achieved by a dry-etching method.

In the defining the contact hole, a thickness of the plasma-treated photoresist pattern may be smaller than a depth of the contact hole.

The plasma-treating of the surface of the photoresist pattern may use Hbr plasma that includes Hbr.

The common electrode may include IZO or a-ITO.

The forming the thin-film transistor may include forming a common line on the substrate, the forming the third insulating layer includes exposing the common line and the common electrode, and the forming the pixel electrode includes forming a connection electrode which connects the common line and the common electrode.

The method of fabricating a display device may further include forming a black matrix or a color filter between the first insulating layer and the second insulating layer.

BRIEF DESCRIPTION OF THE DRAWINGS

The above and other exemplary embodiments and features of the invention will become more apparent by describing in detail exemplary embodiments thereof with reference to the attached drawings, in which.

DETAILED DESCRIPTION

Figure 1:
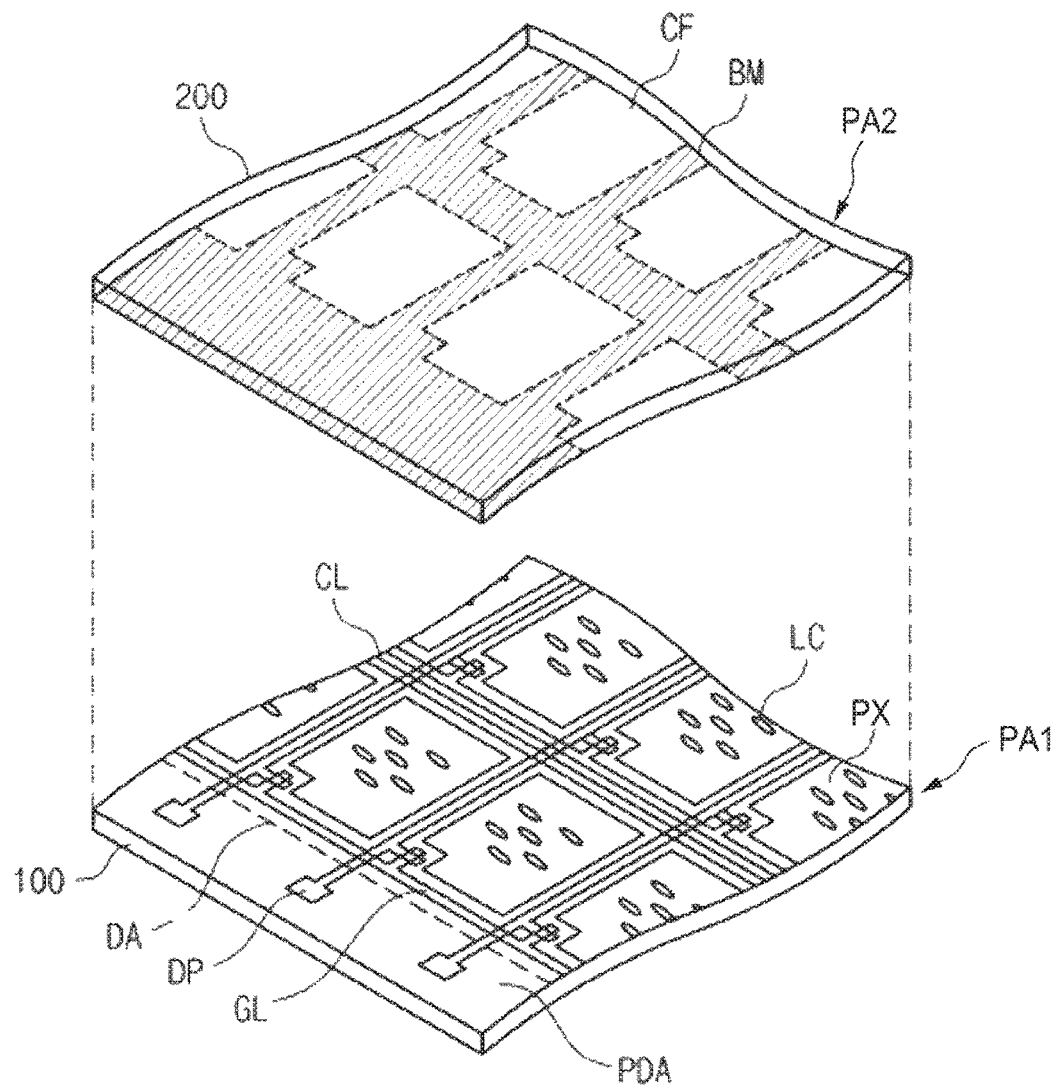
FIG. 1 is a perspective view of an exemplary embodiment of a display device fabricated using a method of fabricating a display device according to the invention.

Advantages and features of the invention and methods of accomplishing the same may be understood more readily by reference to the following detailed description of preferred exemplary embodiments and the accompanying drawings. The invention may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art, and the invention will only be defined by the appended claims.

It will also be understood that when a layer is referred to as being "on" another layer or substrate, it can be directly on the other layer or substrate, or intervening layers may also be present. The same reference numbers indicate the same components throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described with reference to the attached drawings. First, the structure of a display device fabricated using a method of fabricating a display device according to an exemplary embodiment of the invention will be described.

Figure 2:
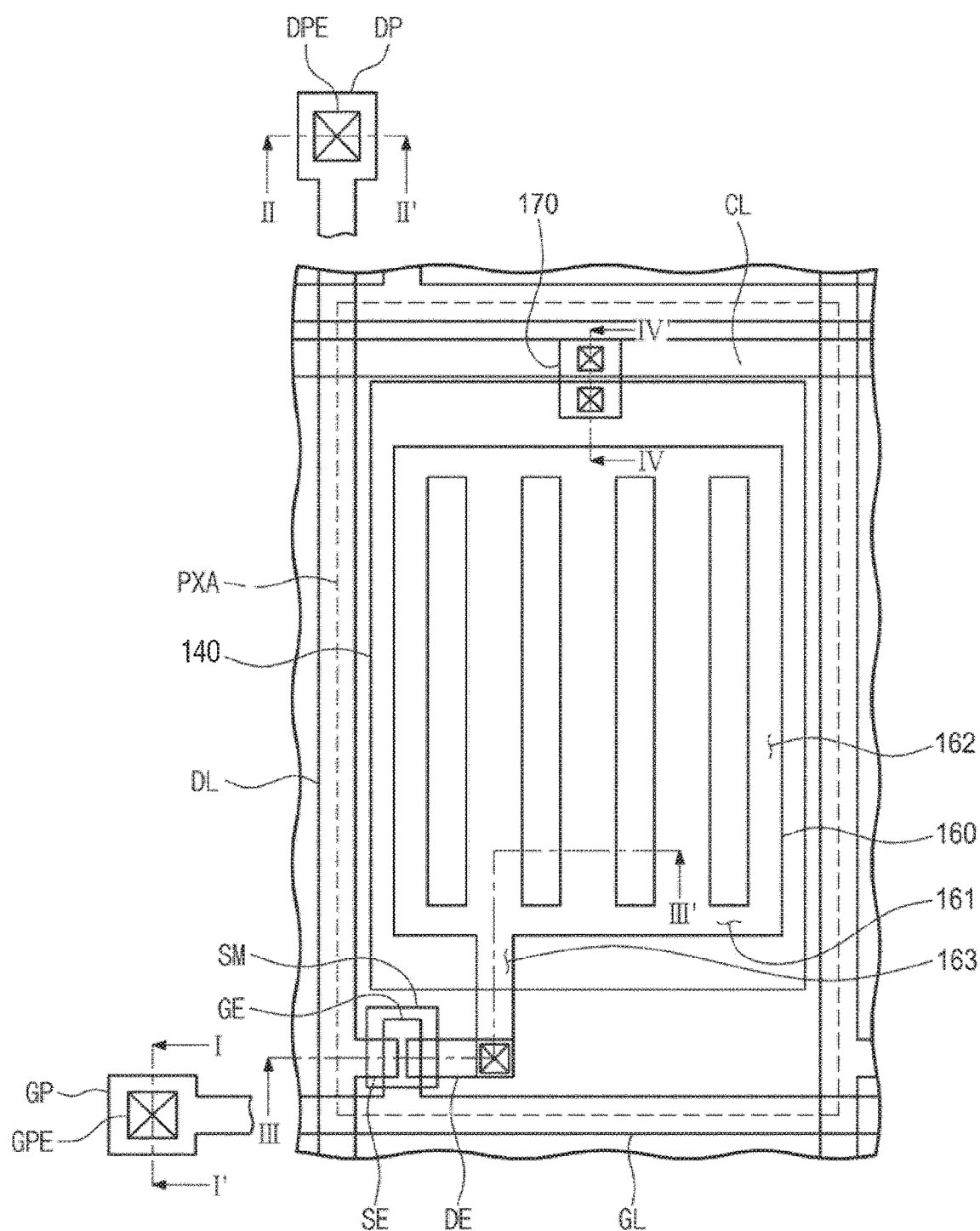
FIG. 2 is a partial plan view of the display device shown in FIG. 1.
Figure 3:
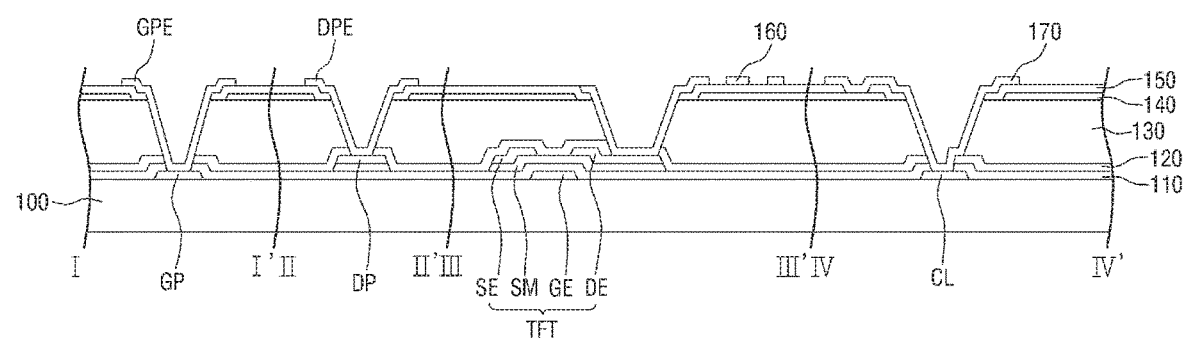
FIG. 3 is a cross-sectional view taken along lines I-I', II-II', III-III' and IV-IV' of FIG. 2.

FIG. 1 is a perspective view of a display device fabricated using a method of fabricating a display device according to an exemplary embodiment of the invention. FIG. 2 is a partial plan view of the display device shown in FIG. 1. FIG. 3 is a cross-sectional view taken along lines I-I', II-II', III-III' and IV-IV' of FIG. 2.

The display device includes a plurality of pixels PX and displays an image. The display device is not limited to a particular display device but may be a liquid crystal display ("LCD") device, an organic light-emitting display device ("OLED"), an electrophoretic display device, an electrowetting display device, a microelectromechanical system ("MEMS") display device, etc. In FIGS. 1 to 3, an LCD device is illustrated as an exemplary embodiment.

Referring to FIGS. 1 to 3, the display device includes a first panel PA1, a second panel PA2 which faces the first panel PA1 and a liquid crystal layer LC which is disposed between the first panel PA1 and the second panel PA2.

The first panel PA1 may include a first substrate 100, at least one gate line GL, at least one data line DL, at least one common line CL, a gate pad GP, a data pad DP, a gate insulating layer 110, a thin-film transistor TFT, a first insulating layer 120, a second insulating layer 130, a common electrode 140, a third insulating layer 150, a pixel electrode 160, a connection electrode 170, a gate pad electrode GPE and a data pad electrode DPE.

The first substrate 100 may include a display area DA and a pad area PDA provided on at least one side of the display area DA. The display area DA is an area where an image is displayed and may include at least one pixel area PXA. In the pixel area PXA, the thin-film transistor TFT and the pixel electrode 160 connected to the thin-film transistor TFT may be disposed. The pad area PDA may be disposed in a non-display area where the image is not displayed.

The gate line GL is disposed in the display area DA of the first substrate 100 and extends along a first direction. The data line DL is disposed in the display area DA of the first substrate 100, extends along a second direction intersecting the first direction, and is insulated from the gate line GL. The common line CL is disposed in the display area DA of the first substrate 100, extends along the first direction, and is insulated from the gate line GL and the data line DL.

The gate pad GP is disposed in the pad area PDA of the first substrate 100 and is connected to an end of the gate line GL. The data pad DP is disposed in the pad area PDA of the first substrate 100 and is connected to an end of the data line DL.

The display area DA will now be described in detail, focusing on the pixel area PXA. In addition, the pad area PDA will be described in detail, focusing on the gate pad GP and the data pad DP.

The gate insulating layer 110 is disposed in both the display area DA and the pad area PDA. The gate insulating layer 110 covers the gate line GL, the common line CL and the gate pad GP disposed on a top surface of the first substrate 100 and including an insulating material. In an exemplary embodiment, the gate insulating layer 110 may include silicon nitride (SiNF) or silicon oxide (SiOx), for example. The data line DL and the data pad DP may be disposed on the gate insulating layer 110. Through holes which expose the common line CL and the gate pad GP are defined in the gate insulating layer 110, for example.

The thin-film transistor TFT is disposed in the pixel area PXA. The thin-film transistor TFT includes a gate electrode GE, a semiconductor layer SM, a source electrode SE and a drain electrode DE.

When viewed from above, the gate electrode GE may protrude from the gate line GL toward the semiconductor layer SM. The gate electrode GE may include any one of indium tin oxide ("ITO"), indium zinc oxide ("IZO") and indium tin zinc oxide ("ITZO"). In addition, the gate electrode GE may have a double layer structure including a first electrode layer including any one of the above materials and a second electrode layer including a material such as a metal, for example, copper (Cu), molybdenum (Mo), aluminum (Al), tungsten (W), chrome (Cr) or titanium (Ti) or an alloy including at least one of the above metals.

The semiconductor layer SM is disposed on the gate electrode GE with the gate insulating layer 110 interposed therebetween. The semiconductor layer SM may include an active layer provided on the gate insulating layer 110 and an ohmic contact layer provided on the active layer. When viewed from above, the active layer is disposed in regions corresponding to regions where the source electrode SE and the drain electrode DE are disposed and a region between the source electrode SE and the drain electrode DE. The ohmic contact layer is disposed between the active layer and the source electrode SE and between the active layer and the drain electrode DE. The semiconductor layer SM may be disposed between the data line DL and the gate insulating layer 110. Also, the semiconductor layer SM may be disposed between the data pad DP and the gate insulating layer 110.

The source electrode SE protrudes from the data line DL and overlaps at least part of the gate electrode GE when viewed from above. The drain electrode DE is separated from the source electrode SE and overlaps at least part of the gate electrode GE when viewed from above. Each of the source electrode SE and the drain electrode DE may be a metal such as Cu, Mo, Al, W, Cr or Ti or an alloy including at least one of the above metals. The source electrode SE and the drain electrode DE partially overlap the semiconductor layer SM in regions excluding the region between the source electrode SE and the drain electrode DE.

The first insulating layer 120 is disposed in both the display area DA and the pad region PDA and is disposed on the gate insulating layer 110. Through holes which expose the drain electrode DE, the common line CL, the gate pad GP and the data pad DP are defined in the first insulating layer 120. The first insulating layer 120 may include, for example, silicon nitride or silicon oxide.

The second insulating layer 130 is disposed in both the display area DA and the pad area PDA and is disposed on the first insulating layer 120. Contact holes corresponding to the through holes of the first insulating layer 120 are defined in the second insulating layer 130. The second insulating layer 120 may include an organic material.

The common electrode 140 is disposed on the second insulating layer 130. Patterning holes corresponding to the contact holes of the second insulating layer 130 are defined in the common electrode 140. The common electrode 140 receives a common voltage through the common line CL. The common electrode 140 may include a transparent conductive material such as IZO or amorphous-ITO ("a-ITO").

The third insulating layer 150 is disposed on the common electrode 140. The third insulating layer 150 has connection holes corresponding to the contact holes of the second insulating layer 130. The third insulating layer 150 may include the same material as the first insulating layer 120.

The pixel electrode 160 is disposed on the third insulating layer 150 located in the display area DA and faces the common electrode 140 with the third insulating layer 150 interposed therebetween. The pixel electrode 160 may include a transparent conductive material, for example, any one of ITO, IZO and ITZO.

The pixel electrode 160 is connected to the drain electrode DE. When viewed from above, the pixel electrode 160 includes at least one stem portion 161, a plurality of branch portions 162 protruding from the stem portion 161 and a connection portion 163 which connects the stem portion 161 and the drain electrode DE. The branch portions 162 are separated from each other by a predetermined gap. The branch portions 162 may extend parallel to each other in a predetermined direction. However, the arrangement pattern of the stem portion 161 and the branch portions 162 is not limited to the arrangement pattern illustrated in FIG. 2. The stem portion 161 and the branch portions 162 can be arranged in various patterns. In an exemplary embodiment, the branch portions 162 may protrude from the stem portion 161 in a direction, for example. Alternatively, the branch portions 162 may protrude in both directions perpendicular to a direction in which the stem portion 161 extends. Alternatively, the stem portion 161 or the branch portions 162 may be bent multiple times.

The connection electrode 170 is disposed on the third insulating layer 150 located in the display area DA and connects the common line CL and the common electrode 140. That is, an end of the connection electrode 170 is connected to the common line CL, and the other end of the connection electrode 170 is connected to the common electrode 140. The connection electrode 170 may be provided at the same time as the pixel electrode 160 and may include the same material as the pixel electrode 160.

The gate pad electrode GPE is disposed on the third insulating layer 150 located in the pad area PDA and is connected to the gate pad GP. The data pad electrode DPE is disposed on the third insulating layer 150 located in the pad area PDA and is connected to the data pad DP. The gate pad electrode GPE and the data pad electrode DPE are contact electrodes which connect external wirings for transmitting signals to the pixel electrode 160. In an exemplary embodiment, each of the gate pad electrode GPE and the data pad electrode DPE may be connected to a flexible circuit board. The gate pad electrode GPE and the data pad electrode DPE may be provided at the same time as the pixel electrode 160 and may include the same material as the pixel electrode 160, for example.

The second panel PA2 includes a second substrate 200, a color filter CF which is disposed on the substrate 200 to correspond to each of the pixels PX and a black matrix BM which surrounds the color filter CF. In an exemplary embodiment, the color filter CF or the black matrix BM may also be disposed between the first insulating layer 120 and the second insulating layer 130 of the first panel PA1.

In the display device structured as described above, the thin-film transistor TFT is turned on in response to a driving signal provided through the gate line GL. When the thin-film transistor TFT is turned on, an image signal provided through the data line DL is provided to the pixel electrode 160 through the thin-film transistor TFT. Accordingly, an electric field is generated between the pixel electrode 160 and the common electrode 140, and liquid crystals of the liquid crystal layer LC are driven by the electric field. As a result, an image is displayed.

A method of fabricating a display device according to an exemplary embodiment of the invention will now be described.

Figure 4:
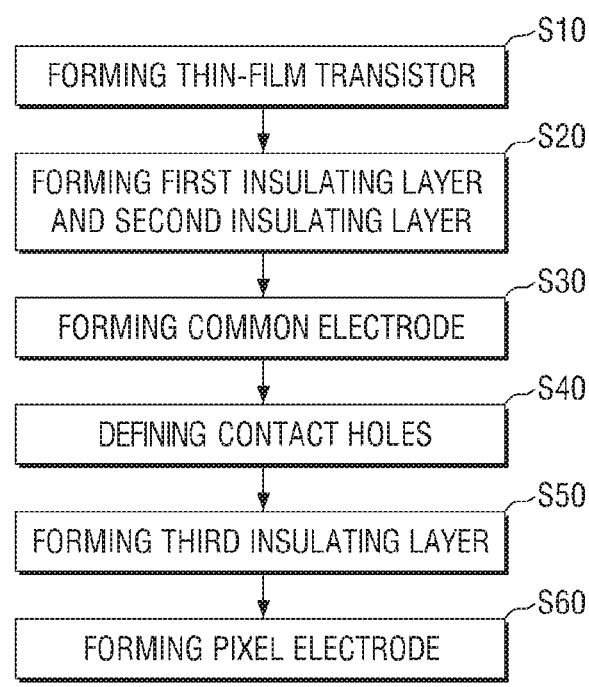
FIG. 4 is a flowchart illustrating a method of an exemplary embodiment of fabricating a display device according to the invention.
Figure 5:
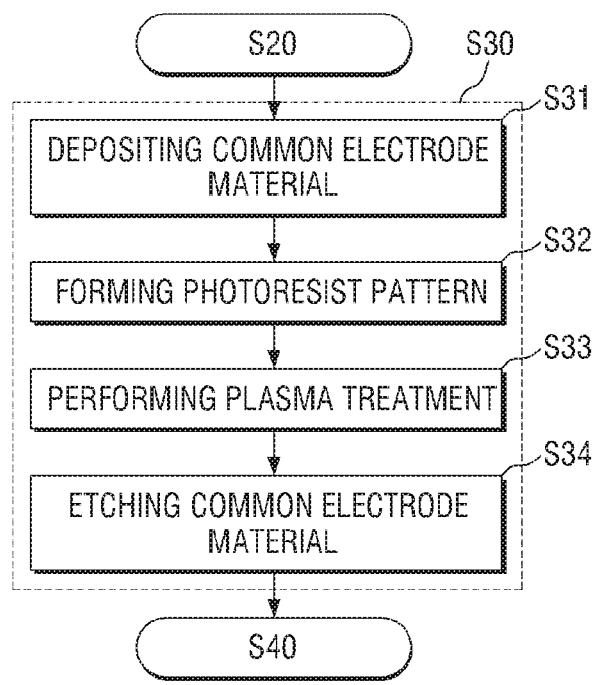
FIG. 5 is a flowchart specifically illustrating an operation of forming a common electrode illustrated in FIG. 4.

FIG. 4 is a flowchart illustrating a method of fabricating a display device according to an exemplary embodiment of the invention. FIG. 5 is a flowchart specifically illustrating an operation of forming a common electrode illustrated in FIG. 4. FIGS. 6 to 16 are cross-sectional views illustrating operations in the method of fabricating a display device illustrated in FIG. 4.

Referring to FIG. 4, the method of fabricating a display device according to the illustrated exemplary embodiment includes forming a thin-film transistor (operation S10), forming a first insulating layer and a second insulating layer (operation S20), forming a common electrode (operation S30), defining contact holes (operation S40), forming a third insulating layer (operation S50) and forming a pixel electrode (operation S60). Referring to FIG. 5, the forming the common electrode (operation S30) may include depositing a common electrode material (operation S31), forming a photoresist pattern (operation S32), performing plasma treatment (operation S33) and etching the common electrode material (operation S34).

Figure 6:
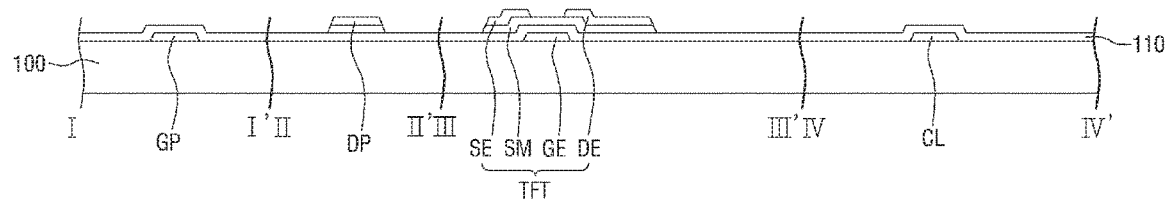
FIGS. 6 to 16 are cross-sectional views illustrating operations in the method of fabricating a display device illustrated in FIG. 4.

Referring to FIGS. 4 and 6, in the forming the thin-film transistor (operation S10), a thin-film transistor TFT is disposed on a first substrate 100 in which a display area DA (see FIG. 1) and a pad area PDA (see FIG. 1) provided on at least one side of the display area DA are defined. The thin-film transistor TFT includes a gate electrode GE, a semiconductor layer SM, a source electrode SE and a drain electrode DE.

Specifically, a conductive layer is disposed on the first substrate 100 by, e.g., a sputtering process, and then patterned using a first photoresist pattern (not shown) to provide a gate line GL (see FIG. 1) and a common line CL. At this time, a gate pad GP and the gate electrode GE are also provided. The first photoresist pattern may include a photoresist material such as an organic photosensitive material.

A gate insulating layer 110 is disposed on the first substrate 100 having the gate pad GP, the gate electrode GE and the common line CL by a plasma enhanced chemical vapor deposition ("PECVD") process.

A semiconductor layer SM and a conductive layer are sequentially stacked on the gate insulating layer 110 and then patterned using a second photoresist pattern (not shown) to provide a data line DL (see FIG. 1), the source electrode SE connected to the data line DL (see FIG. 1) and the drain electrode DE separated from the source electrode SE. At this time, a data pad DP is also provided. The second photoresist pattern may include a photoresist material such as an organic photosensitive material.

Figure 7:
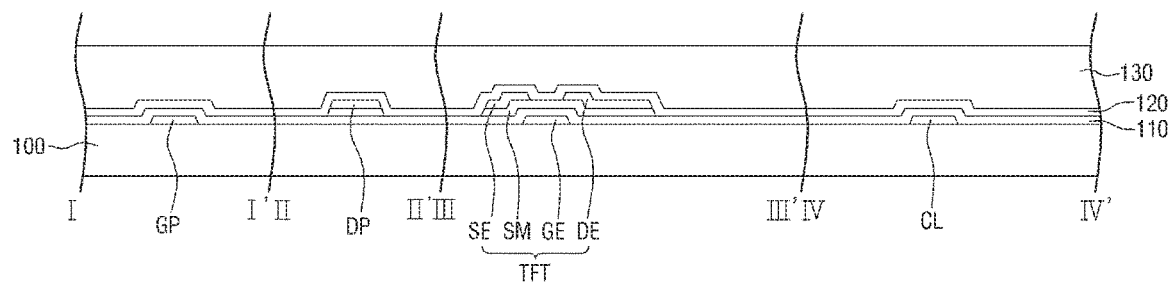

Referring to FIGS. 4 and 7, in the forming the first insulating layer and the second insulating layer (operation S20), a first insulating layer 120 and a second insulating layer 130 are sequentially disposed on the thin-film transistor TFT.

Specifically, the first insulating layer 120 is disposed on the gate insulating layer 110 to cover the thin-film transistor TFT and the data pad DP. The first insulating layer 120 may be a protective layer and may include silicon nitride or silicon oxide by a PECVD process.

The second insulating layer 130 is disposed on the whole surface of the first insulating layer 120. The second insulating layer 130 may include an organic material, such as acrylic resin, by a deposition process, a coating process, a printing process, etc. without an exposure process.

Referring to FIGS. 4 and 8 to 12, in the forming the common electrode (operation S30), a common electrode 140 is disposed on the second insulating layer 130.

Figure 8:
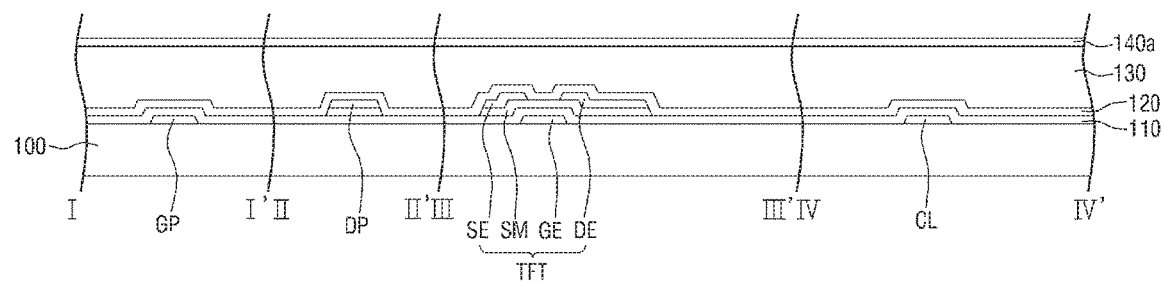

Specifically, referring to FIGS. 5 and 8, a common electrode material 140a is deposited on the second insulating layer 130 (operation S31).

Figure 9:
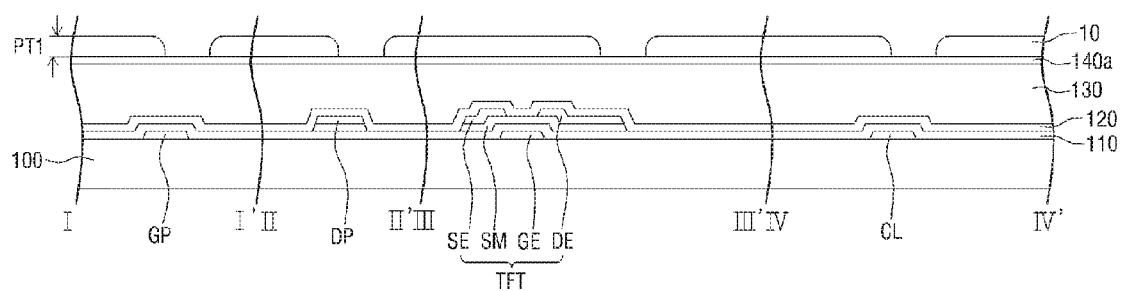
Figure 10:
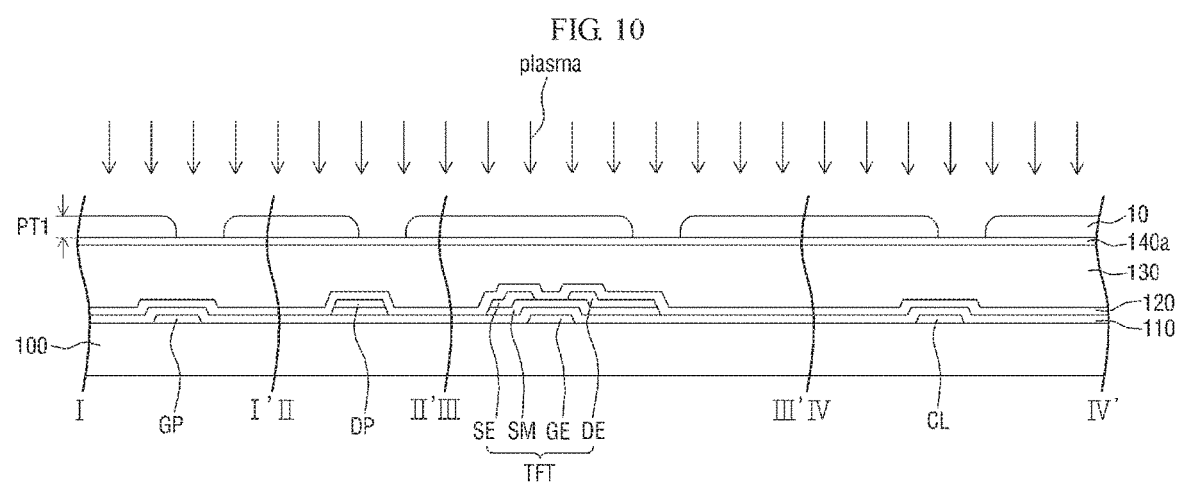

Referring to FIGS. 5 and 9, a third photoresist pattern 10 is disposed on the common electrode material 140a (operation S32). The third photoresist pattern 10 may be provided by disposing a photoresist layer on the third electrode material 140a and patterning the photoresist layer using exposure and development processes. Here, the third photoresist pattern 10 may have a first thickness PT1. The third photoresist pattern 10 may include a photoresist material such as an organic photosensitive material. The third photoresist pattern 10 may be provided by at least partially omitting a baking process. In exemplary embodiments, the third photoresist pattern 10 may be provided only by soft baking and without hard baking or may be provided without both soft baking and hard baking, for example.

Figure 11:
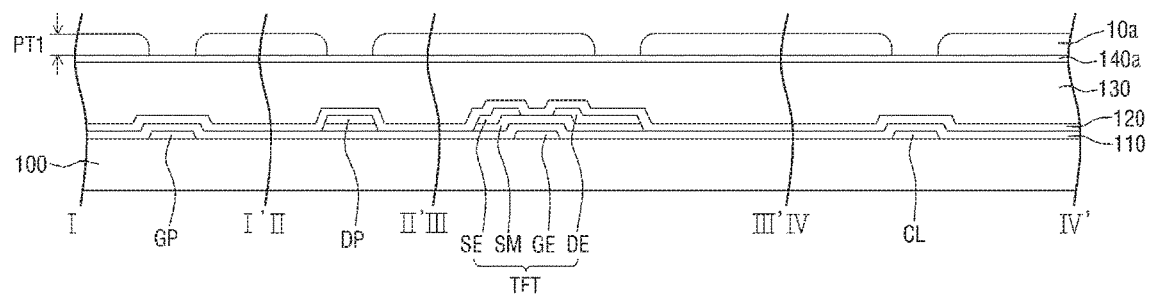

Referring to FIGS. 5 and. 10, plasma treatment is performed on a surface of the third photoresist pattern 10 (operation S33). The plasma treatment may be performed using hydrogen bromide (Hbr) plasma that includes Hbr. The Hbr plasma may include at least one additive selected from helium (He), oxygen ($O_2$) and nitrogen ($N_2$). The plasma treatment of the third photoresist pattern 10 may result in a formation of a cured photoresist pattern 10a as shown in FIG. 11.

Figure 12:
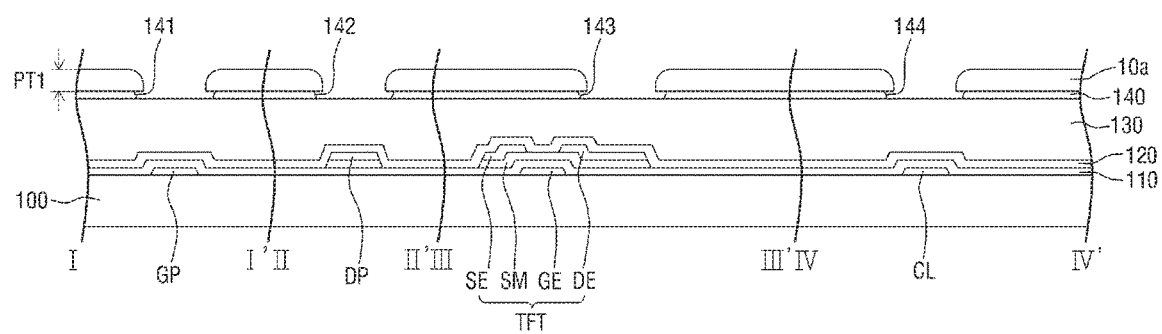

The common electrode material 140a is etched using the plasma-treated photoresist pattern 10a as a mask, thereby holes 141 through 144 are defined in the common electrode 140 as shown in FIG. 12 (operation S34). Here, the etching the common electrode material 140a may be achieved by wet etching.

Figure 13:
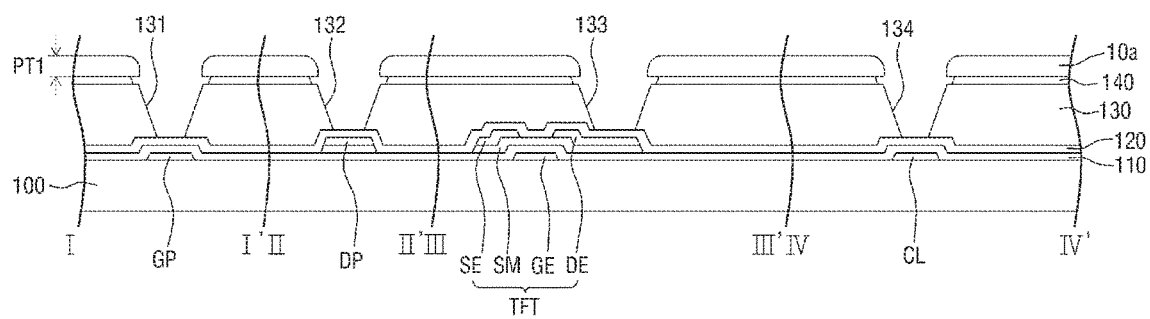
Figure 14:
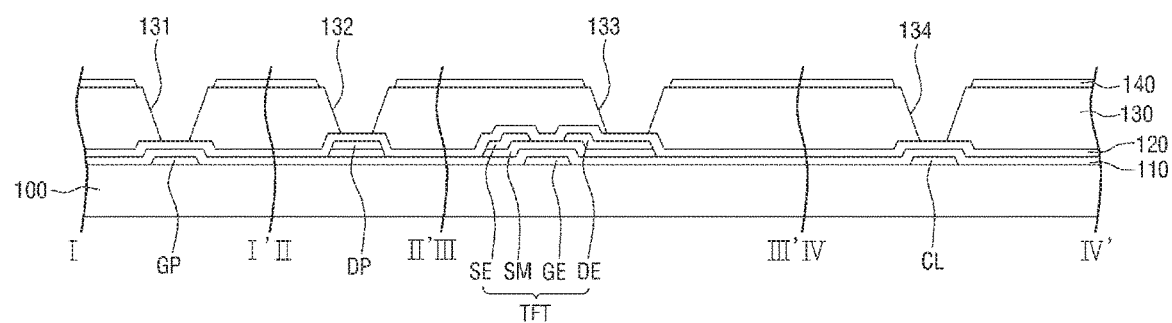

Referring to FIGS. 4, 13 and 14, in the defining the contact holes (operation S40), contact holes 131 through 134 are defined in the second insulating layer 130.

Specifically, referring to FIG. 13, the second insulating layer 130 is etched using the plasma-treated photoresist pattern 10a and the common electrode 140 as a mask. As a result, the contact holes 131 through 134 are defined in regions of the second insulating layer 130 which correspond respectively to the gate pad GP, the data pad DP, the drain electrode DE and the common electrode CL. Here, the etching of the second insulating layer 130 may be achieved by dry etching, and plasma including $O_2$ or $O_2$+fluorine (F) may be used in the dry etching.

Since the photoresist pattern 10a is cured before the etching of the second insulating layer 130 as described above, an etch rate of the photoresist pattern 10a may be lower than an etch rate of the third photoresist pattern 10 (see FIG. 9) provided (e.g., formed) by at least partially omitting a baking process and an etch rate of the second insulating layer 130 provided by a deposition process, a coating process, a printing process, etc. without an exposure process.

Accordingly, when the contact holes 131 through 134 are defined by dry-etching the second insulating layer 130 using the photoresist pattern 10a as a mask, the photoresist pattern 10a is not required to have a thickness equal to or greater than a depth of the contact holes 131 through 135. That is, the thickness PT1 of the photoresist pattern 10a may be smaller than the depth of the contact holes 131 through 134. Accordingly, the amount of photoresist used to define the contact holes 131 through 134 can be reduced. When an etch rate of an insulating layer is equal to an etch rate of a photoresist pattern, in case that contact holes are defined by dry-etching the insulating layer using the photoresist pattern as a mask, the photoresist pattern is required to have a thickness equal to or greater than a depth of the contact holes. This is because the photoresist pattern is removed by a thickness equal to the depth of the contact holes when portions of the insulating layer are removed to define the contact holes.

In addition, since the photoresist pattern 10a has the thickness PT1 smaller than the depth of the contact holes 131 through 134 defined in the second insulating layer 130, contact holes with fine widths can be defined in the second insulating layer 130. Accordingly, this can increase the resolution of the display device.

Referring to FIG. 14, after the defining the contact holes 131 through 134 in the second insulating layer 130, the photoresist pattern 10a is removed by a strip process.

Figure 15:
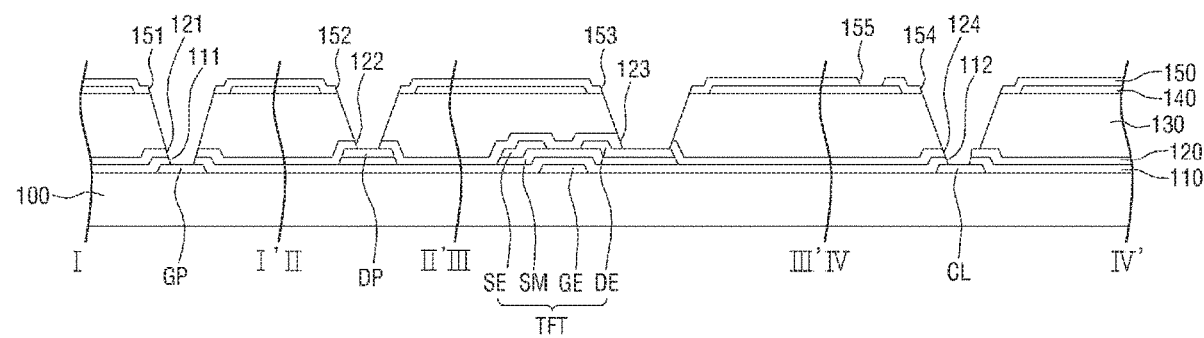

Referring to FIGS. 4 and 15, in the forming the third insulating layer (operation S50), a third insulating layer 150 is provided to cover the common electrode 140.

Specifically, the third insulating layer 150 is provided by disposing a silicon nitride layer or a silicon oxide layer on the common electrode 140, the second insulating layer 130 and the first insulating layer 120 by a PECVD process and patterning the silicon nitride layer or the silicon oxide layer using a fourth photoresist pattern (not shown). Here, a through hole 111 of the gate insulating layer 110, a through hole 121 of the first insulating layer 120, and a connection hole 151 of the third insulating layer 150 which expose the gate pad GP may be defined, and a through hole 122 of the first insulating layer 120 and a connection hole 152 of the third insulating layer 150 which expose the data pad DP may be defined. In addition, a through hole 123 of the first insulating layer 120 and a connection hole 153 of the third insulating layer 150 which expose the drain electrode DE may be defined, and a through hole 112 of the gate insulating layer 110, a through hole 124 of the first insulating layer 120 and a connection hole 154 of the third insulating layer 150 which expose the common line CL may be defined. Also, a connection hole 155 of the third insulating layer 150 which exposes the common electrode 140 may be defined.

Figure 16:
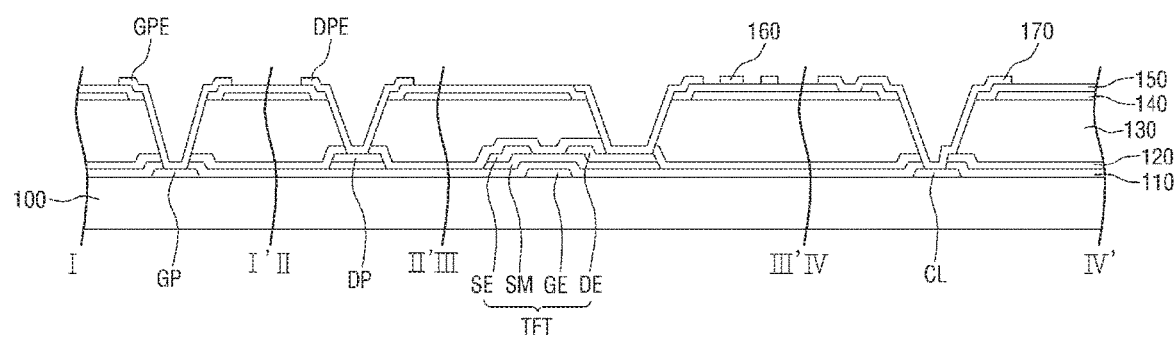

Referring to FIGS. 4 and 16, in the forming the pixel electrode (operation S60), a pixel electrode 160 connected to the drain electrode DE is disposed on the third insulating layer 150.

Specifically, the pixel electrode 160 is provided by forming a transparent conductive material layer on the third insulating layer 150 and patterning the transparent conductive material using a fifth photoresist pattern (not shown). At this time, a gate pad electrode GPE connected to the gate pad GP, a data pad electrode DPE connected to the data pad DP and a connection electrode 170 connecting the common line CL and the common electrode 140 may also be provided.

Although not shown in the drawings, the method of fabricating a display device according to the illustrated exemplary embodiment includes forming a black matrix or a color filter between the first insulating layer 120 and the second insulating layer 130 and may realize a black matrix-on-array ("BOA") display device or a color filter-on-array ("COA") device.

In the method of fabricating a display device according to the illustrated exemplary embodiment, the contact holes 131 through 134 are defined by dry-etching the second insulating layer 130 using the plasma-treated and cured photoresist pattern 10a, which has a lower etch rate than the etch rate of the second insulating layer 130 and using the common electrode 140 as a mask. Therefore, the thickness PT1 of the photoresist pattern 10a needed to define the contact holes 131 through 134 can be reduced.

Accordingly, the method of fabricating a display device according to the illustrated exemplary embodiment can reduce the amount of photoresist used to define the contact holes 131 through 134 in the second insulating layer 130. In addition, since contact holes having fine widths can be defined using the thin photoresist pattern 10a, the resolution of a display device can be increased.

A method of fabricating a display device according to another exemplary embodiment of the invention will now be described.

Figure 17:
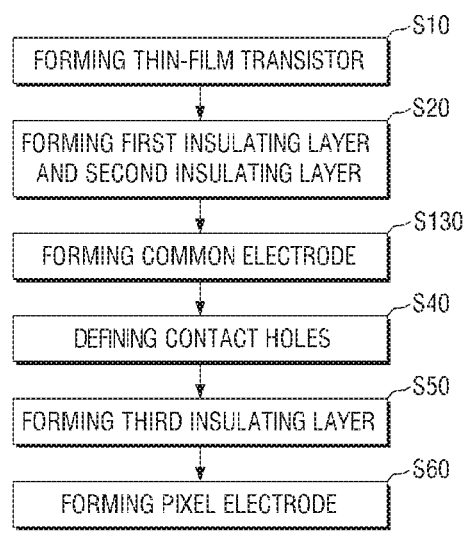
FIG. 17 is a flowchart illustrating a method of fabricating a display device according to another exemplary embodiment of the invention.
Figure 18:
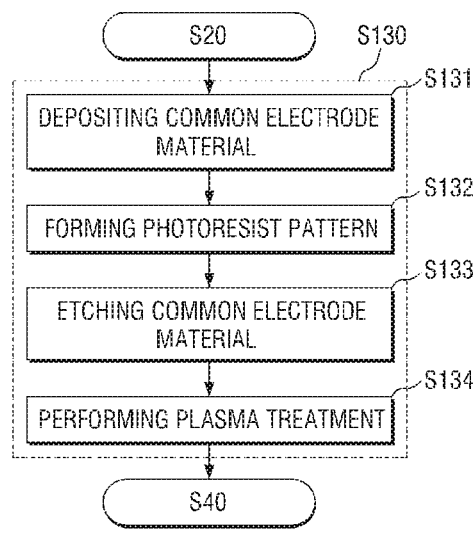
FIG. 18 is a flowchart specifically illustrating an operation of forming a common electrode illustrated in FIG. 17.
Figure 19:
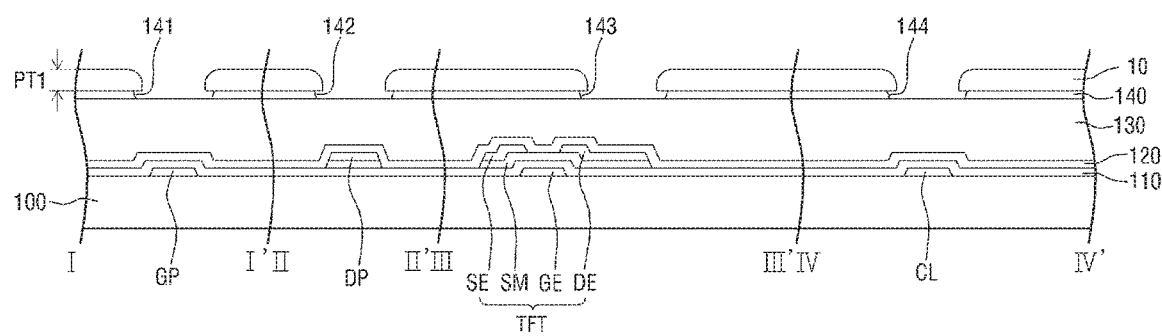
FIGS. 19 to 21 are cross-sectional views illustrating operations in the operation of forming the common electrode illustrated in FIG. 17.
Figure 20:
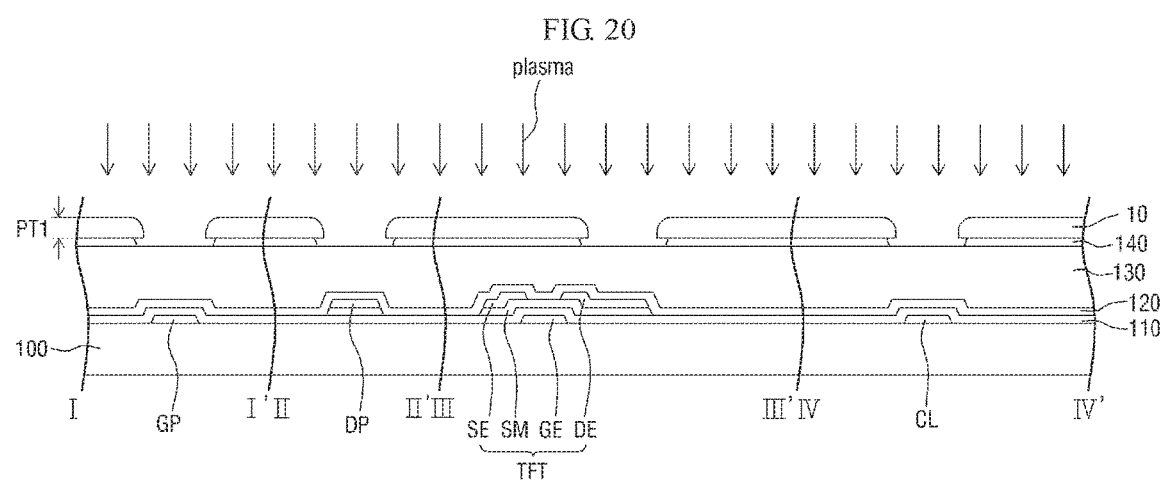
Figure 21:
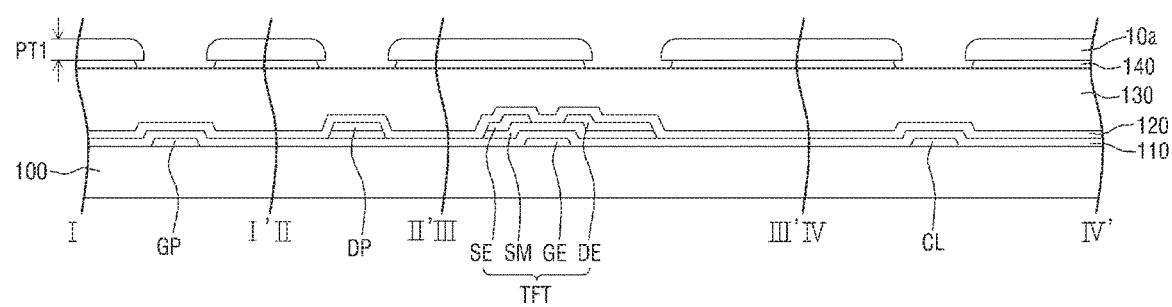

FIG. 17 is a flowchart illustrating a method of fabricating a display device according to another exemplary embodiment of the invention. FIG. 18 is a flowchart specifically illustrating an operation of forming a common electrode illustrated in FIG. 17. FIGS. 19 to 21 are cross-sectional views illustrating operations in the operation of forming the common electrode illustrated in FIG. 17.

Referring to FIG. 17, the method of fabricating a display device according to the illustrated exemplary embodiment includes forming a thin-film transistor (operation S10), forming a first insulating layer and a second insulating layer (operation S20), forming a common electrode (operation S130), defining contact holes (operation S40), forming a third insulating layer (operation S50) and forming a pixel electrode (operation S60). Referring to FIG. 18, the forming the common electrode (operation S130) may include depositing a common electrode material (operation S131), forming a photoresist pattern (operation S132), etching the common electrode material (operation S133) and performing plasma treatment (operation S134).

Since the forming the thin-film transistor (operation S10), the forming the first insulating layer and the second insulating layer (operation S20), the defining the contact holes (operation S40), the forming the third insulating layer (operation S50), and the forming the pixel electrode (operation S60) have been described above, a redundant description thereof will be omitted.

Referring to FIGS. 17 to 22, in the forming the common electrode (operation 130), a common electrode 140 is disposed on a second insulating layer 130. The forming the common electrode (operation S130) is different from the forming the common electrode (operation S30) of FIG. 4 in that the performing the plasma treatment (operation S134) is carried out after the etching of the common electrode material (operation S133).

Specifically, a common electrode material 140a is deposited on the second insulating layer 130 (operation S131; see operation S31 in FIG. 8), a third photoresist pattern 10 is disposed on the common electrode material 140a (operation S132; see operation S32 in FIG. 9), and the common electrode material 140a (see FIG. 9) is etched using the third photoresist pattern 10 as a mask, thereby forming the common electrode 140 having patterning holes 141 through 144 as shown in FIG. 19. Here, the etching of the common electrode material 140a (see FIG. 9) may be achieved by wet etching.

Referring to FIG. 20, plasma treatment is performed on a surface of the third photoresist pattern 10 (operation S134). The plasma treatment of the third photoresist pattern 10 may result in the formation of a cured photoresist pattern 10a as shown in FIG. 21.

In the method of fabricating a display device according to the illustrated exemplary embodiment, contact holes 131 through 134 are defined by dry-etching the second insulating layer 130 using the plasma-treated and cured photoresist pattern 10a, which has a lower etch rate than an etch rate of the second insulating layer 130 and the common electrode 140 as a mask. Therefore, a thickness of the photoresist pattern 10a needed to define the contact holes 131 through 134 can be reduced.

Accordingly, the method of fabricating a display device according to the illustrated exemplary embodiment can reduce the amount of photoresist used to define the contact holes 131 through 134 in the second insulating layer 130. In addition, since contact holes having fine widths can be defined using the thin photoresist pattern 10a, the resolution of a display device can be increased.

Exemplary embodiments of the invention provide at least one of the following advantages.

In a method of fabricating a display device according to an exemplary embodiment of the invention, contact holes are defined by dry-etching an insulating layer using a plasma-treated and cured photoresist pattern, which has an etch rate lower than an etch rate of the insulating layer and a common electrode as a mask. Therefore, a thickness of the photoresist pattern needed to define the contact holes can be reduced.

Accordingly, the method of fabricating a display device according to the exemplary embodiment of the invention can reduce the amount of photoresist used to define the contact holes in the insulating layer. In addition, since contact holes having fine widths can be defined using the thin photoresist pattern, the resolution of a display device can be increased.

However, the effects of the invention are not restricted to the one set forth herein. The above and other effects of the invention will become more apparent to one of daily skill in the art to which the invention pertains by referencing the claims.

In concluding the detailed description, those skilled in the art will appreciate that many variations and modifications can be made to the preferred exemplary embodiments without substantially departing from the principles of the invention. Therefore, the disclosed preferred exemplary embodiments of the invention are used in a generic and descriptive sense only and not for purposes of limitation.

What is claimed is:

1. A method of fabricating a display device, the method comprising:
    forming a thin-film transistor, which comprises a gate electrode, a source electrode and a drain electrode, on a substrate;
    forming a first insulating layer and a second insulating layer on the thin-film transistor;
    forming a common electrode on the second insulating layer by depositing a common electrode material on the second insulating layer, etching the common electrode material using a photoresist pattern provided on the common electrode material as a mask, and then plasma-treating a surface of the photoresist pattern;
    defining a contact hole in a region of the second insulating layer which corresponds to the drain electrode by using the plasma-treated photoresist pattern and the common electrode as a mask;
    forming a third insulating layer on the second insulating layer and the common electrode to expose the contact hole and the drain electrode; and
    forming a pixel electrode, which is connected to the drain electrode, on the third insulating layer.

2. The method of claim 1, wherein the forming the second insulating layer is achieved by coating an organic material on a whole surface of the first insulating layer.

3. The method of claim 1, wherein the defining the contact hole is achieved by a dry-etching method.

4. The method of claim 1, wherein in the defining the contact hole, a thickness of the plasma-treated photoresist pattern is smaller than a depth of the contact hole.

5. The method of claim 1, wherein the plasma-treating the surface of the photoresist pattern uses hydrogen bromide plasma which comprises hydrogen bromide.

6. The method of claim 1, wherein the common electrode includes indium zinc oxide or amorphous-indium tin oxide.

7. The method of claim 1, wherein
the forming the thin-film transistor comprises forming a common line on the substrate,
the forming the third insulating layer comprises exposing the common line and the common electrode, and
the forming the pixel electrode comprises forming a connection electrode which connects the common line and the common electrode.

8. The method of claim 1, further comprising forming a black matrix or a color filter between the first insulating layer and the second insulating layer.

* * * * *